(12) United States Patent
Yan et al.

(10) Patent No.: US 6,547,977 B1
(45) Date of Patent: Apr. 15, 2003

(54) METHOD FOR ETCHING LOW K DIELECTRICS

(75) Inventors: Chun Yan, Santa Clara, CA (US); Gary C. Hsueh, San Jose, CA (US); Yan Ye, Campbell, CA (US); Diana Xiaobing Ma, Saratoga, CA (US)

(73) Assignee: Applied Materials Inc., Santa Clara, CA (US)

( * ) Notice: Subject to any disclaimer, the term of this patent is extended or adjusted under 35 U.S.C. 154(b) by 123 days.

(21) Appl. No.: 09/610,915

(22) Filed: Jul. 5, 2000

Related U.S. Application Data (63) Continuation of application No. 09/054,285, filed on Apr. 2, 1998, now abandoned.

(51) Int. Cl.[7] .................. C03C 15/00; C03C 25/68; C23F 1/00; H01L 21/302; H01L 21/461

(52) U.S. Cl. .............. 216/72; 216/67; 216/74; 216/79; 216/81; 438/735; 438/743

(58) Field of Search .............. 216/57, 67, 74, 216/79, 81, 72, 64; 438/725, 735, 737, 742, 743; 204/192.31, 192.35, 192.36, 192.37

(56) References Cited

U.S. PATENT DOCUMENTS

| | | | | |
|---|---|---|---|---|
| 4,473,437 A | * | 9/1984 | Higashikawa et al. | 156/643 |
| 4,613,400 A | | 9/1986 | Tan et al. | 156/643 |
| 4,786,360 A | | 11/1988 | Cote et al. | 156/643 |
| 4,832,787 A | | 5/1989 | Bondur et al. | 156/643 |
| 4,968,552 A | | 11/1990 | Linde | 428/195 |
| 5,007,983 A | | 4/1991 | Lerner et al. | 156/643 |
| 5,024,975 A | | 6/1991 | Hartmann | 501/65 |
| 5,070,046 A | | 12/1991 | Hu | 501/9 |
| 5,119,170 A | | 6/1992 | Iwamatsu | 357/68 |
| 5,196,381 A | | 3/1993 | Hu et al. | 501/10 |
| 5,525,534 A | | 6/1996 | Ikemasu et al. | 437/60 |
| 5,565,384 A | | 10/1996 | Havemann | 437/228 |
| 5,591,677 A | | 1/1997 | Jeng | 437/195 |
| 5,679,608 A | | 10/1997 | Cheung et al. | 437/195 |
| 5,707,486 A | * | 1/1998 | Collins | 156/643.1 |
| 5,880,018 A | | 3/1999 | Boeck et al. | 438/619 |
| 5,880,033 A | * | 3/1999 | Tsai | 438/710 |
| 5,950,106 A | * | 9/1999 | May et al. | 438/669 |
| 5,968,847 A | * | 10/1999 | Ye et al. | 438/734 |
| 6,040,248 A | * | 3/2000 | Chen et al. | 438/725 |
| 6,340,435 B1 | * | 1/2002 | Bjorkman et al. | 216/72 |
| 6,387,819 B1 | * | 5/2002 | Yu | 438/725 |
| 6,440,870 B1 | * | 8/2002 | Nallan et al. | 438/734 |

FOREIGN PATENT DOCUMENTS

| | | | | |
|---|---|---|---|---|
| DE | 4434891 A1 | 4/1996 | ......... | H01L/21/768 |
| EP | 0 023 146 A2 | 1/1981 | ......... | H01L/21/90 |
| EP | 0 820 093 A1 | 1/1998 | ......... | H01L/21/311 |
| JP | 04171723 | 6/1992 | ......... | H01L/21/302 |
| JP | 05121371 | 5/1993 | ......... | H01L/21/302 |
| WO | 9719462 | 5/1997 | | |

OTHER PUBLICATIONS

C. Steinbrüchel, Patterning of Copper for Multilevel Metallization: Reactive Ion Etching and Chemical–Mechanical Polishing:, *Applied Surface Science 91* (*1995*), pp. 139–146.

* cited by examiner

*Primary Examiner*—Patrick Ryan
*Assistant Examiner*—Julian Mercado
(74) *Attorney, Agent, or Firm*—Shirley L. Church; Joseph Bach (57) ABSTRACT

The present disclosure pertains to a method for plasma etching of low k materials, particularly polymeric-based low k materials. Preferably the polymeric-based materials are organic-based materials. The method employs an etchant plasma where the major etchant species are generated from a halogen other than fluorine and oxygen. The preferred halogen is chlorine. The volumetric (flow rate) ratio of the halogen:oxygen in the plasma source gas ranges from about 1:20 to about 20:1. The atomic ratio of the halogen:oxygen preferably falls within the range from about 1:20 to about 20:1. When the halogen is chlorine, the preferred atomic ratio of chlorine:oxygen ranges from about 1:10 to about 5:1. When this atomic ratio of chlorine:oxygen is used, the etch selectivity for the low k material over adjacent oxygen-comprising or nitrogen-comprising layers is advantageous, typically in excess of about 10:1. The plasma source gas may contain additives in an amount of 15% or less by volume which are designed to improve selectivity for the low k dielectric over an adjacent material, to provide a better etch profile, or to provide better critical dimension control, for example. When the additive contains fluorine, the amount of the additive is such that residual chlorine on the etched surface of the low k material comprises less than 5 atomic %.

32 Claims, 9 Drawing Sheets

METHOD FOR ETCHING LOW K DIELECTRICS

This application is a continuation application of application Ser. No. 09/054,285, filed Apr. 2, 1998 now abandoned.

BACKGROUND OF THE INVENTION

1. Field of the Invention

The present invention pertains to a method of etching low "k" dielectric materials. The method may be used for patterned etching or for etchback applications. The method is particularly useful for etching low k materials comprising at least about 80 percent by weight of a polymeric material. Typically, the polymeric material is an organic based material. In addition, the method may be used for the etching of low k materials having an inorganic constituent which is susceptible to a plasma comprising chlorine and oxygen species.

2. Brief Description of the Background Art

In the field of semiconductor device fabrication, it is well recognized that as device feature sizes decrease to $0.18\mu$ and smaller, RC delay of interconnects becomes a major limiting factor for device speed. There are two areas of development focusing on this problem. The interconnect conductor resistance is being reduced by the use of copper and other conductors having a lower resistance (R) than aluminum, which has been the industry standard for conductive interconnect material. The second area of focus is the use of a dielectric material having a lower dielectric constant (k) than silicon dioxide, which has been the industry standard dielectric. Presence of a lower k dielectric reduces the interconnect contribution to the capacitance (C).

There are two alternate technologies which are used in the formation of semiconductor interconnect structures. The first technology is known as damascene technology. In this technology, a typical process for producing a multilevel structure using copper as the conductive material for feature sizes in the range of 0.25 micron ($\mu$m) or less would include: blanket deposition of a dielectric material; patterning of the dielectric material to form openings; deposition of a diffusion barrier layer and, typically, a wetting layer to line the openings; deposition of a copper layer onto the substrate in sufficient thickness to fill the openings; and removal of excessive conductive material from the substrate surface using chemical-mechanical polishing (CMP) techniques. The method requires a patterned etching of the dielectric material. The damascene process is described in detail by C. Steinbruchel in "Patterning of copper for multilevel metallization: reactive ion etching and chemical-mechanical polishing", *Applied Surface Science* 91 (1995) 139–146.

The competing technology is one which involves the patterned etch of the conductive copper layer. In this technology, a typical process would include deposition of a copper layer on a desired substrate (typically a dielectric material having a barrier layer on its surface); application of a hard masking material and a photoresist over the copper layer; pattern etching of the photoresist, hard masking material, and copper layer using wet or dry etch techniques; and deposition of a dielectric material over the surface of the patterned copper layer, to provide isolation of conductive lines and contacts which comprise various integrated circuits. Subsequent to application of the dielectric material, it is typically necessary to etch back the dielectric material to expose contact points on the conductive lines and contacts.

U.S. Pat. No. 5,591,677, issued to Shin-Pun Jeng in January of 1997, describes a multi-level interconnect structure having embedded low-dielectric constant insulators, and a method for making the structures. In particular, the dielectric portion of the structure includes layers of low dielectric constant organic polymers used in combination with layers of silicon dioxide. The patent describes the problems inherent in using organic polymers as dielectrics, due to thermal stability problems and etching difficulties. However, the inventor has developed a method of etching back the organic low k dielectric material to expose the upper surface of a plurality of interconnect lines. In particular, the etching is carried out using an oxygen plasma etch with a small amount of $CF_4$ present. Low k dielectrics which are recommended for use in the method are the polytetrafluoroethylene "Teflon" (a trademark of Du Pont Corporation); benzocyclobutene (BCB); parylene; polyimide; or other material having a dielectric constant less than 3.9. Parylene is used in the preferred embodiment.

U.S. Pat. No. 5,565,384 to Havemann, issued Oct. 15, 1996, describes a self-aligned via using low permittivity dielectric. The low permittivity dielectric is used to reduce capacitance between adjacent conductors on a connection layer. The method of fabricating the via includes the filling of horizontal gaps between patterned conductors with an organic-containing dielectric material (Allied Signal 500 Series), forming an inorganic dielectric layer over the organic-containing dielectric material, and using a high density plasma comprising fluorocarbons to etch the silicon dioxide while not appreciably etching the organic-containing dielectric material. The organic-containing material reduces the device capacitance while acting as an etch stop, preventing overetching due to either misalignment between the vias and the patterned conductors, or uneven topography across the semiconductor device. The majority of the interlayer dielectric is constructed from oxide or other common dielectrics which possess good heat transfer and structural characteristics.

U.S. Pat. No. 5,679,608 to Cheung et al., issued Oct. 21, 1997, discloses the use of a low dielectric constant material, such as benzocyclobutene or a derivative thereof, as a spin on dielectric over a metal interconnect. In particular, a low dielectric constant material is defined as one having a dielectric constant which is less than that of silicon dioxide (less than about 4.0).

PCT application No. PCT/DE96/02108 of Lauterbach et al. describes a vertically integrated semiconductor component in which the component planes are produced on different substrates and connected by a connection layer of benzocyclobutene. Various organic-comprising layers are said to be plasma etched using a plasma comprising $CF_4/O_2$ plasma.

German patent application number DE 4434891 Al, of Lauterbach, published on Sep. 29, 1994, describes the use of bisbenzocyclobutene as a spin on dielectric which can be etched back to expose a conductive element using a $CF_4$-based plasma.

Inorganic low k dielectric materials for use in multi-layered circuits for high density semiconductor applications are also known. Generally such materials comprise lead-free amorphous borosilicate glass.

The plasma etching processes described above have included the presence of a fluorine-containing component in the plasma source gas. However, the use of fluorine-comprising etchants is harmful to the environment. Further, when fluorocarbon etchants are used, there is typically a large amount of polymer deposition on device surfaces. In some applications, there is a silicon dioxide layer (or other layer which is readily etched by fluorine) underlying the low k dielectric material. If fluorine is used to etch the low k dielectric, the etch selectivity for the low k dielectric over an adjacent underlying layer may not be acceptable. For example, by the time the low k dielectric layer is etched, an underlying hard mask (such as silicon dioxide and silicon nitride) may be gone. Further, the presence of residual etch process fluorine on the surface of the etched low k dielectric film in an amount which exceeds about 5 atomic % of the film surface composition creates problems in subsequent process integration.

It would be highly advantageous to have a method for etching organic-based (and in some instances inorganic) low k dielectric materials which employs a chemistry which does not suffer from the deficiencies described above with reference to the fluorine-comprising plasma etchants. Preferably the etch chemistry is suitable for etching a number of different kinds of low k materials; exhibits a high etch rate (greater than about 8,000 Å/min); exhibits high selectivity for the low k material relative to adjacent oxides and nitrides; provides a good etch profile and critical dimension control; produces minimal emission gases; and is low in cost.

SUMMARY OF THE INVENTION

The present invention pertains to semiconductor processing, and to a method for plasma etching of low dielectric constant (low k) materials, particularly polymeric-based low k materials. The polymer-based materials may comprise silicon or fluorine or a combination thereof. Preferably the polymeric low k materials contain less than about 10 atomic % silicon and less than about 5 atomic % fluorine. The method employs plasma etching where the major etchant species of the plasma comprise a halogen other than fluorine and oxygen. Preferably the halogen is chlorine. The source of halogen species in the etch plasma may be $Cl_2$, $Br_2$, $I_2$, ICl, IBr, BrCl, or a halogen-containing compound such as HCl, $BCl_3$, $CHCl_3$, $CH_2Cl_2$, $CCl_4$, $C_2H_3Cl_3$, $C_2H_4Cl_2$, $SiCl_4$, HBr, $CH_3Br$, $C_2H_2Br_2Cl_2$, HI, $CCl_2O$, $CCl_3NO_2$, or a combination thereof which does not react in a harmful or impractical manner (wherein impractical means that an adverse reaction affecting the safety and effectiveness of the process occurs). The source of oxygen species in the etch plasma may be one of the oxygen-comprising compounds listed above, or $O_2$, CO, $CO_2$, $CH_4O$, $C_2H_6O$, $N_2O$, $NO_2$, $O_3$, $H_2O$, or a combination thereof, so long as the combination of the halogen-comprising material and the oxygen-comprising material does not react in a harmful or impractical manner.

When the source gases for the etch plasma comprise chlorine, or bromine, or iodine gas used in combination with oxygen, the volumetric (flow rate) ratio of the halogen gas:oxygen ranges from about 1:20 to about 20:1. When the source of the halogen species is a halogen-comprising compound, the atomic ratio of halogen:oxygen ranges from about 1:20 to about 20:1. When the halogen is chlorine, preferably, the atomic ratio of chlorine to oxygen ranges from about 1:10 to about 5:1, whereby the etch selectivity for the low k material over adjacent oxygen-comprising or nitrogen-comprising layers is advantageous.

The plasma source gas may contain additives designed to improve selectivity for the low k dielectric over an adjacent material or to provide a better etch profile, for example. When additive gases are present, the combination of such gases is typically less than about 15 volumetric percent of the total plasma source gas supply. Examples of additives which may be combined with the major plasma source gases are $N_2$, $H_2$, $C_xH_y$ (where x is typically less than about 3 and y is typically less than about 8), $CF_4$, and $NF_3$, with the additive being selected to be compatible with the halogen-comprising and oxygen-comprising plasma source gases of the kind described above. Noble gases such as helium, neon, argon, krypton, and xenon may also be used as additives Typically, the etch rate for the low k dielectric material using a chlorine/oxygen comprising plasma source gas is at least about 8,000 Å/min. This etch rate is expected for a halogen:oxygen atomic ratio ranging from about 1:10 to about 5:1, depending on other plasma process parameters. Preferably the selectivity for the low k dielectric material over an adjacent layer of nitrogen-comprising material such as $Si_3N_4$ or an adjacent layer of oxygen-comprising material such as $SiO_2$ is at least about 10:1. This selectivity is obtained when the plasma species halogen:oxygen atomic ratio ranges from about 1:10 to about 5:1, depending on other plasma process parameters.

Generally, the low k dielectric material is patterned using an overlying patterning "hard" mask which comprises a material such as silicon nitride or silicon dioxide. The pattern in the hard mask is frequently generated using a photoresist. In some instances, the low k dielectric material is patterned using a combination of a hard mask and a photoresist. When the patterning hard mask includes silicon dioxide, a fluorine-comprising plasma source gas may be used for patterning of the hard mask, followed by the chlorine/oxygen-comprising plasma source gas for transferring the pattern through the low k dielectric layer. When the patterning mask consists of materials which can be uniformly etched (within 10% or less variation in surface height across a wafer surface) at an etch rate of at least about 1,000 Å/min. using the chlorine/oxygen comprising gas, it is preferred to avoid the use of a fluorine-comprising gas source for forming the etch plasma.

BRIEF DESCRIPTION OF THE DRAWINGS

FIG. 2 A shows the etch rate of benzocyclobutene (BCB) as a function of the volumetric (flow rate) ratio of the chlorine:oxygen plasma source gases.

DETAILED DESCRIPTION OF THE PREFERRED EMBODIMENTS

A method is disclosed for the etching of low k materials, particularly polymeric-based low k materials. The method employs plasma etching where the major etchant species of the plasma comprise chlorine and oxygen. The plasma source gas may contain additives designed to improve selectivity for the low k dielectric over an adjacent material or to provide a better etch profile, for example. Preferably, the etch rate for the low k dielectric material using the chlorine/oxygen comprising plasma source gas is at least about 8,000 Å/min. Preferably the selectivity for the low k dielectric material over an adjacent layer of nitrogen-comprising material is at least about 10:1 and the selectivity for the low k dielectric material over an adjacent layer of oxygen-comprising material is at least about 10:1.

Although the equipment used for etching the preferred embodiment materials described herein was a decoupled plasma source Centura® Integrated Processing System, other kinds of etch processing equipment where the plasma is generated through inductive coupling or capacitive coupling or resonant coupling, or combinations thereof can be used as well. Some examples of preferred equipment include: A process chamber having an internal device located above the substrate surface, which device assists in plasma generation through inductive coupling; a process chamber which is supplied with a plasma from a remotely-generated source; a process chamber having a device located external to the chamber which assists in plasma generation through inductive coupling; and a process chamber which utilizes a parallel plate device which assists in plasma generation through capacitive coupling.

I. DEFINITIONS

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to "a conductive material" includes metals such aluminum, copper, platinum, silver, iridium, rubidium, and combinations and alloys thereof, as well as other conductive materials which would be suitable in the application described.

Specific terminology of particular importance to the description of the present invention is defined below.

The term "decoupled plasma source" or "DPS" as used herein refers to a plasma etch apparatus with separate controls for the inductive coupling of RF power which primarily controls plasma density (source power) and the bias power which primarily controls ion bombardment energy of the substrate surface.

The term "feature" refers to metal lines, trenches and openings in a dielectric layer, and other structures which make up the topography of the substrate surface. Feature size often refers to the size of the smallest feature on the wafer.

The term "ion bombardment" refers to the collision of ions with a surface. The ions are accelerated toward the surface by electric fields in the vicinity of the surface exposed to a plasma.

The term "low k dielectric" refers to any material having a k value lower than that of silicon dioxide (k≈4.0).

The term "polymeric-based low k dielectric" refers to a low k dielectric having a polymeric component of at least about 80% by weight.

The term "plasma" refers to a partially ionized gas containing an approximately equal number of positive and negative charges, as well as some other number of non-ionized gas species.

The term "selectivity" is used to refer to a) a ratio of etch rates of two materials; and b) a condition achieved during etch when etch rate of one material is increased in comparison with another material.

The term "source power" refers to the power that is responsible for sustaining the plasma by providing a major portion of the energy to ionize the neutral species in the chamber.

The term "stack" or "etch stack" refers to a collection of layers of different materials deposited one over the other, at least a portion of which are etched during an etching process.

The term "substrate" includes semiconductor materials, glass, ceramics, polymeric materials, and other materials of use in the semiconductor industry.

The term "vertical profile" refers to a feature profile wherein a cross-section of the feature exhibits side walls which are perpendicular to the surface on which the feature stands. Alternatively, a "positive profile" is one wherein the width of the cross-section of the feature is larger at the surface on which the feature stands than at a distance away from the surface.

II. AN APPARATUS FOR PRACTICING THE INVENTION

The preferred embodiment etch processes described herein were carried out in a Centura® Integrated Processing System available from Applied Materials, Inc. of Santa Clara, Calif. The system is shown and described in U.S. Pat. No. 5,186,718, the disclosure of which is hereby incorporated by reference. Although the etch process chamber used in the EXAMPLES presented herein is shown in schematic in FIG. 1, any of the etch processors available in the industry should be able to take advantage of the etch chemistry described herein, with some adjustment to other process parameters. The equipment shown in schematic in FIG. 1 includes a Decoupled Plasma Source (DPS) of the kind described by Yan Ye et al. at the Proceedings of the Eleventh International Symposium of Plasma Processing, May 7, 1996 and as published in the Electrochemical Society Proceedings, Volume 96-12, pp. 222–233 (1996). The plasma processing chamber enables the processing of an 8 inch (200 mm) diameter wafer.

Figure 1:
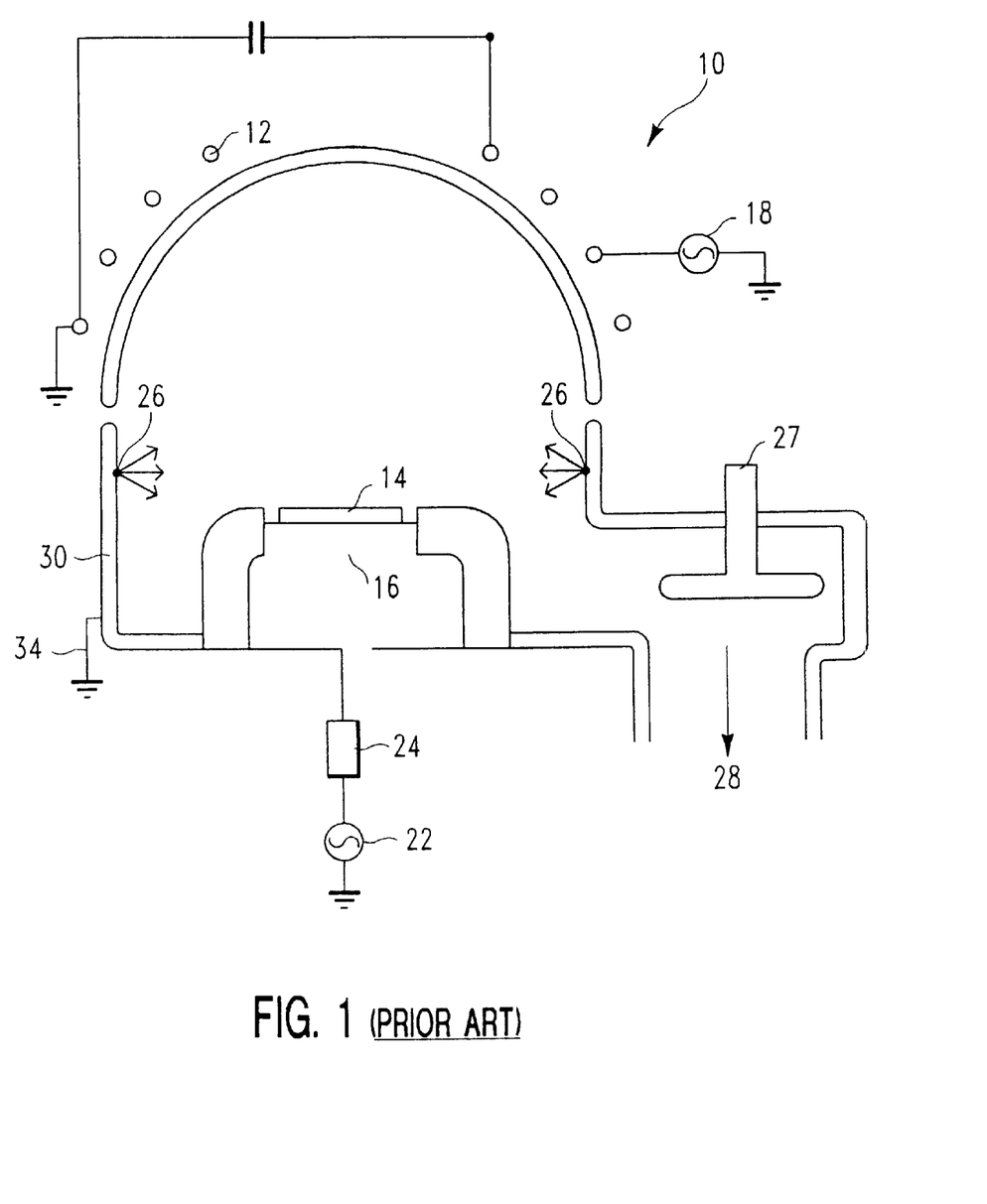
FIG. 1 shows a schematic of a preferred embodiment plasma processing apparatus of the kind which can be used to carry out the etching processes described herein.

The processing chamber 10, as shown in FIG. 1A, is constructed to include at least one inductive coil antenna segment 12 positioned exterior to the etch process chamber 10 and connected to a radio frequency (RF) power generator 18 (source power generator with a frequency tunable around 2 MHZ for impedance matching at different plasma conditions). Interior to the process chamber is a substrate 14 support pedestal (cathode) 16 which is connected to an RF frequency power generator 22 (bias power generator of frequency fixed at 13.56 MHZ) through an impedance matching network 24, and a conductive chamber wall 30 which serves as the electrical ground 34 for the offset bias which accumulates on the substrate 14 as a result of the RF power applied to the substrate support pedestal 16.

The semiconductor substrate 14 is placed on the support pedestal 16 and gaseous components are fed into the process chamber through entry ports 26. A plasma is ignited in process chamber 10 by applying RF powers 18 and 22. Pressure interior to the etch process chamber 10 is controlled using a vacuum pump (not shown) and a throttle valve 27 situated between process chamber 10 and the vacuum pump. The temperature on the surface of the etch chamber walls is controlled using liquid-containing conduits (not shown) which are located in the walls of the etch chamber 10. The temperature of the semiconductor substrate is controlled by stabilizing the temperature of the support pedestal and flowing helium gas in the channels formed by the back of the substrate and grooves (not shown) on the pedestal 16 surface. The helium gas is used to facilitate heat transfer between the substrate and the pedestal. During the etch process, the substrate surface is gradually heated by the plasma to a steady state temperature which is approximately 25–40° C. higher than the substrate support platen temperature, depending on the process conditions. It is estimated that the substrate surface temperature was typically around 75° C. during most of our experiments. The surface of the etching chamber 10 walls was maintained at about 80° C. using the cooling conduits previously described.

III. EXAMPLES OF THE ETCHING OF LOW K DIELECTRIC MATERIALS

A particular plasma etch chemistry has been demonstrated to provide advantages in the etching of a number of low k materials. Both general etching (demonstrative of an etch back technique) and patterned etching for feature sizes in the range of $0.25\mu$ have been demonstrated. The etch chemistry is based on the use of chlorine and oxygen plasma species in combination. Promising etch rates, etch selectivity over adjacent materials, and excellent etch profile have been obtained. As previously described, the etching process was carried out in a 200 mm DPS Centura® Metal Etch system. The cathode temperature was set at about 30° C., which typically resulted in an etch substrate surface temperature of about 75° C. Substrate temperature was maintained using helium gas as a heat transfer agent to the backside of the substrate, with the helium pressure between the cathode and the substrate backside being about 7 Torr.

Four low k dielectric materials were evaluated in detail: Divinylsiloxane bis-benzocyclobutene (BCB), which is available as CYCLOTENE™ from the Dow Chemical Co., Midland, Mich., and contains about 5 atomic % silicon; SILK™, which is also available from the Dow Chemical Co., and is very similar to BCB, but does not contain silicon; FLARE 2.0™, available from Allied Signal Advanced Microelectronic Materials, Sunnyvale, Calif., which is a proprietary material and, despite its name, does not contain fluorine; and, Fluorinated polyimide, FPI- 136M, available from DuPont Company of Wilmington, Del. The latter two materials contain no silicon.

Although the BCB, SILK™, FLARE 2.0™, and FPI are discussed in detail herein, there are numerous other low k dielectric materials which are expected to behave in a similar manner when etched in accordance with the method of the present invention, using the etch chemistry described herein. These other low k dielectric materials include Poly (arylene)ethers; Poly(arylene)ether oxazoles; Fluorinated poly(arylene)ethers (FLARE); Parylene-N; Parylene-F; Parylene-AF; Parylene-AF4; Polyimides; Polynapthalene-N; Polynaphthalene-F; Perfluorocyclobutene (PFCB); Polytetrafluoroethylene (PTFE); Polyphenyl-Quinoxalines (PPQ); Polybenzoxazoles; Polyindane; Polynorborene; Polystyrene; Polyphenyleneoxide; Polyethylene; Polypropylene; and similar materials.

The four low k dielectric materials which were evaluated in detail were etched as a single layer upon a thermal oxide substrate. The thickness of the dielectric material was about 10,000 Å.

EXAMPLE 1

During the development of the proper etch chemistry, that is, the proper plasma source gas content for etching BCB, the other process parameters known to have the greatest effect on etch rate were held constant. The total flow rate of the plasma source gases was maintained at about 100 sccm. The RF plasma source power was about 1200 W. The bias power was about 200 W. The process chamber pressure was about 12 mT and the substrate support platen (cathode) temperature was maintained at about 30° C. The etch time was approximately 30 seconds.

Table 1, below shows the etch rate results, and the uniformity of etch rate across the BCB substrate surface, as a function of the plasma source gas content.

TABLE 1

| $Cl_2$ (sccm) | $O_2$ (sccm) | $N_2$ (sccm) | $CHF_3$ (sccm) | Etch Rate (Å/min.) | $1\sigma$ (%) |
|---|---|---|---|---|---|
| 60 | 40 | | | 6,700 | 4.57 |
| 60 | 25 | 15 | | 6,000 | 3.92 |
| 60 | 25 | | 15 | 6,000 | 4.16 |
| | 60 | 40 | | 700 | 4.52 |
| | 80 | 20 | | 400 | 7.68 |

The data in Table 1 show clearly that the best etch rate performance results for BCB were obtained when chlorine and oxygen alone were used as the plasma source gases. The addition of $N_2$ or $CHF_3$ reduced the etch rate slightly, but resulted in an improvement in etch rate uniformity across the etch substrate surface. It is expected that the addition of limited amounts of $N_2$ or $CHF_3$ to the $Cl_2/O_2$ source gases would assist in profile and critical dimension control during the etching of patterned substrates.

The etch rate obtained for $O_2/N_2$ chemistry was extremely low. This was a surprising result, because dielectric etchers showed good results using this chemistry. Upon further investigation, it was determined that the good results obtained using the $O_2/N_2$ chemistry were actually obtained because of the presence of fluorine in the process chamber. The fluorine was residual fluorine from the prior etch process used for the hard mask opening process step.

EXAMPLE 2

Figure 2A:
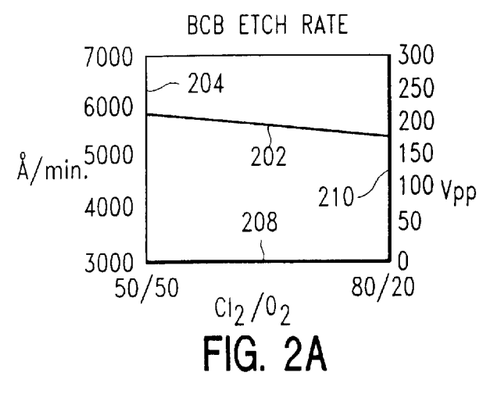

Based on the preliminary data shown in Table 1, an L4 orthogonal matrix was designed to look for trends resulting from the change in critical process parameters. In particular, FIGS. 2A, 3A and 4A show the effect on etch rate of BCB attributable to change in the $Cl_2:O_2$ volumetric ratio of the plasma source gases; the effect on etch rate of a change in the RF Bias Power to the substrate support platen; and, the effect on etch rate of a change in the RF Source Power to the plasma, respectively. Corresponding FIGS. 2B, 3B, and 4B, show the non uniformity of the BCB etch rate as a function of the same process variables, respectively.

Figure 2B:
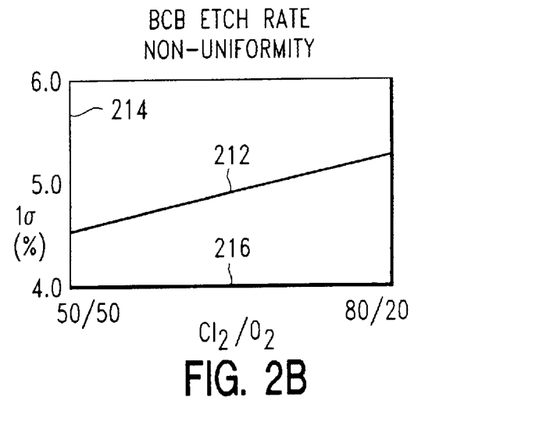
FIG. 2B shows the substrate surface etch non-uniformity for BCB as a function of the flow rate ratio of the chlorine:oxygen plasma source gases.
Figure 3A:
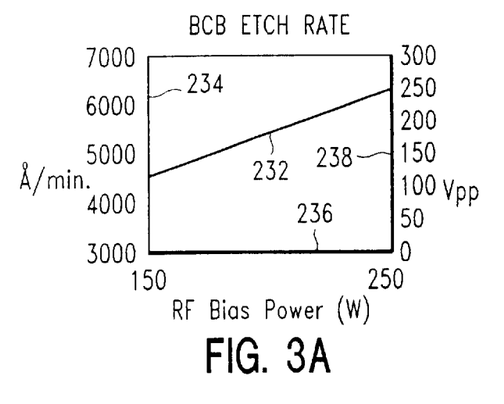
FIG. 3A shows the BCB etch rate as a function of the RF Bias Power.

With reference to FIGS. 2A and 2B: Curve 202 of FIG. 2A shows the etch rate for BCB as a function of the volumetric ratio of $Cl_2:O_2$ in the plasma source gas. The etch rate is shown in Å/min. on scale 204, and the $Cl_2:O_2$ ratio is shown on scale 208. As is readily apparent, there is a decrease in the etch rate with an increase in the ratio, over the range evaluated. In addition, as will be discussed in more detail later, the ratio of $Cl_2:O_2$ must be carefully balanced for optimizing the etch rate of BCB relative to adjacent materials such as substrate etch stops and barrier layers.

The variation in uniformity of the etch rate over the substrate surface is shown in FIG. 2B. Scale 214 shows the % of the 1 σ variation (standard variation based on a 49 point measurement) in the thickness difference between the pre-etched and post etched wafer. It is desirable to maintain the variation in etch rate uniformity at a minimum. Industry standards typically require that such variation be held below about 5%.

Figure 3B:
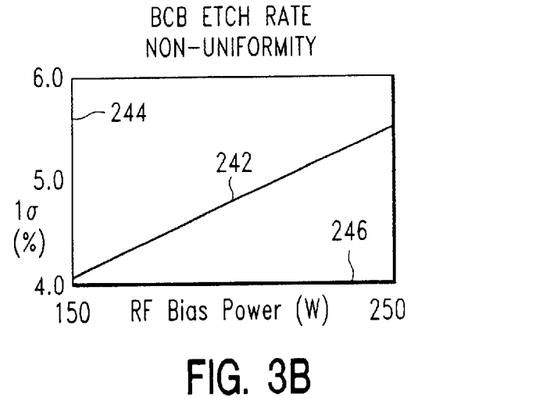
FIG. 3B shows the substrate surface etch non-uniformity for BCB as a function of the RF Bias Power.
Figure 4A:
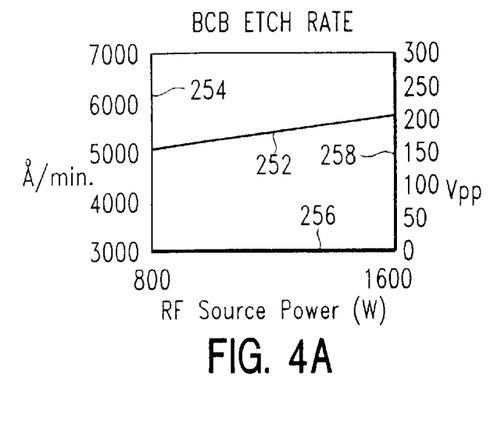
FIG. 4A shows the BCB etch rate as a function of the RF Source Power.
Figure 4B:
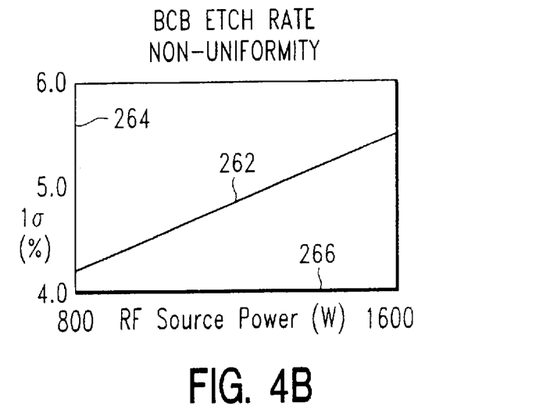
FIG. 4B shows the substrate surface etch non-uniformity for BCB as a function of the RF Source Power.

With reference to FIGS. 3A and 3B: Curve 232 in FIG. 3A shows the etch rate for BCB as a function of the RF Bias Power to the substrate support platen. The etch rate is shown in Å/min. on scale 234, and the Bias Power is shown on scale 236. Clearly an increase in Bias Power over the range shown has a very significant effect on the etch rate of the BCB. Of the three variables evaluated, Bias Power had the most significant effect on etch rate. The variation in etch rate uniformity over the BCB substrate as a function of the Bias Power is shown in FIG. 3B, as curve 242. The % 1 σ variation in the thickness difference between the pre etched and post etched wafer is shown on scale 244, with the Bias Power shown on scale 246. An increase in the Bias Power over the range shown, from 150 W to 250 W, resulted in an increase in non-uniformity of the etched substrate surface from about 4% to about 5.6%.

With reference to FIGS. 4A and 4B: Curve 252 in FIG. 4A shows the etch rate for BCB as a function of the RF Source Power to the plasma. The etch rate is shown in Å/min. on scale 254, and the Source Power is shown on scale 256. An increase in Source Power over the range shown clearly results in a significant increase in the etch rate of the BCB. The variation in etch rate uniformity as a function of RF Source Power is shown in FIG. 4B. The % 1 σ variation in the thickness difference between the pre-etched and post etched wafer is shown on scale 264, with the Source Power shown on scale 266. An increase in the Source Power over the range shown, from 800 W to 1600 W, resulted in an increase in non-uniformity of the etched surface from about 4.2% to about 5.4%.

EXAMPLE 3

Figure 5:
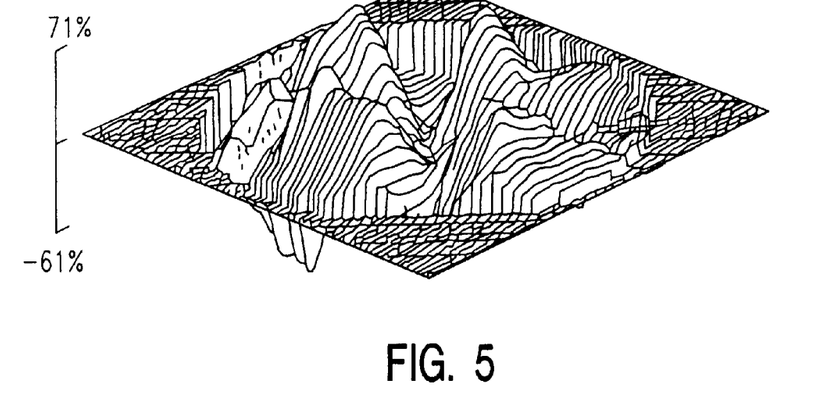
FIG. 5 shows a three dimensional substrate surface schematic for a BCB surface etched with a chlorine/oxygen plasma source gas where the ratio of chlorine to oxygen was too low. (Despite inadequate performance with respect to BCB, this plasma source gas works well with some other low k dielectric materials which do not contain silicon.)

In view of the decrease in etch rate of the BCB observed as the volumetric ratio of $Cl_2:O_2$ increased over 1:1 (over 50 sccm of $Cl_2$ to 50 sccm of $O_2$), we decided to investigate a lower $Cl_2:O_2$ ratio. We evaluated a $Cl_2:O_2$ ratio of 0.7:1.0 (70 sccm of $Cl_2$:100 sccm of $O_2$). However, we discovered that when a sufficiently oxygen-rich plasma source gas is used, the topography of the etched surface may become unacceptable. FIG. 5 shows a schematic of the three dimensional etched BCB surface produced. The % 1 σ variation was 33.6%. A careful inspection of the etched surface showed that etch did not occur at some locations on the BCB surface. It is believed that oxygen reacts with silicon in the BCB film to form an oxide hard mask which stops the etch process.

EXAMPLE 4

Figure 6A:
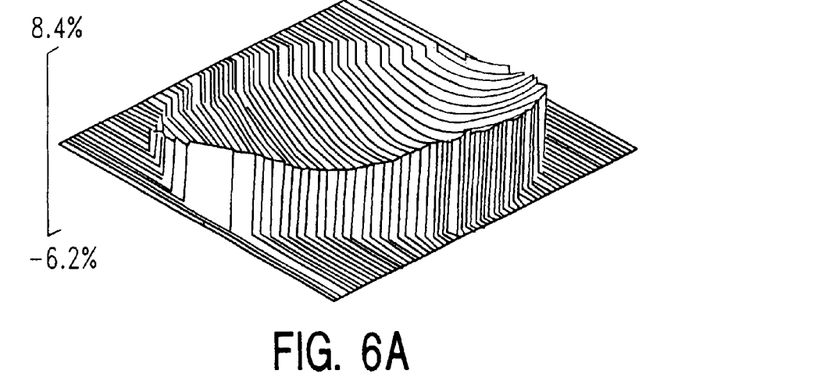
FIGS. 6A and 6B each show a three dimensional substrate surface schematic for a BCB surface etched with a chlorine/oxygen plasma source gas where the ratio of chlorine to oxygen was better (although the etch rate at the pumping port side of the process chamber was a little slower).
Figure 6B:
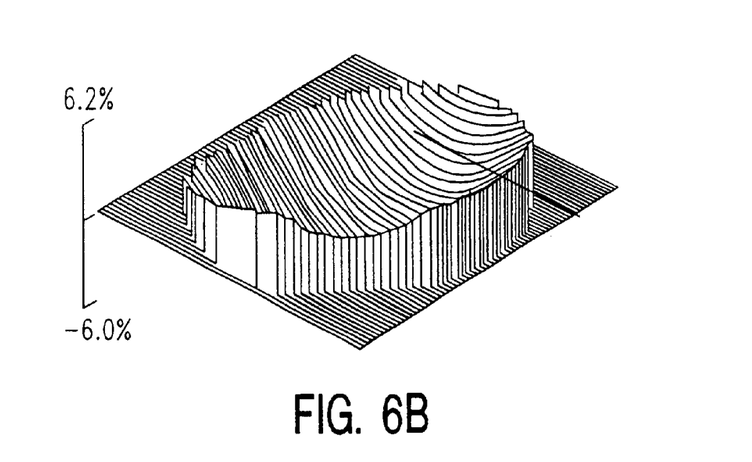

Based on the determination that an oxygen-rich plasma could present problems in the etching of BCB, a decision was made to evaluate selectivity to BCB over other substrate materials using a $Cl_2:O_2$ ratio of 1:1. FIGS. 6A and 6B show schematics of the three dimensional etched BCB surfaces which were etched using a $Cl_2:O_2$ ratio of 1.0:1.0 (60 sccm of $Cl_2$ to 60 sccm of $O_2$). Other process conditions were as follows: Source Power was 1,200 W; Bias Power was 350 W; process vessel pressure was 12 mT; helium heat transfer pressure on the backside of the substrate was 7 T; the temperature of the cathode upon which the BCB substrate was supported was about 30° C. The etch time was about 40 seconds. The % of 1 σ variation is shown on the scale to the left side of the etch surface profile shown in FIGS. 6A and 6B. Adjustments in process chamber gas flow patterns led to the improvement in etch rate uniformity shown between FIG. 6A and FIG. 6B.

This etch chemistry was evaluated not only for its effect on the etched surface uniformity, but also for its effect on etch rate and etch selectivity for the BCB compared with thermally deposited silicon oxide, silicon nitride, and I-line photoresist. This data is presented below in Table 2.

TABLE 2

| Substrate | Etch Rate (Å/min.) | 1σ (%) |
|---|---|---|
| BCB | 9,200 | 4.49 |
| Oxide | 220 | 6.22 |
| Nitride | 680 | 11.12 |
| I-Line PR | 7,900 | 2.67 |

Using this etch chemistry, we achieved a high BCB etch rate and simultaneously a high BCB selectivity over both silicon oxide and silicon nitride. It should be noted that the etch rate pattern is skewed, being lower at the pumping port side of the process chamber. A hardware modification is being made to solve this deficiency.

EXAMPLE 5

In order to improve BCB selectivity over nitride, and etch surface uniformity, the process chamber pressure was increased to 14 mT. Since an increase in chamber pressure was observed to have a negative impact on BCB etch rate, RF bias power was increased from 350 W to 450 W to more strongly attract ions toward the BCB substrate. The other process variables were maintained at the values given above with reference to Table 3. The performance data for this modification in process variables is presented below in Table 3.

TABLE 3

| Substrate | Etch Rate (Å/min.) | 1σ (%) |
| --- | --- | --- |
| BCB | 8,700 | 3.75 |
| Oxide | 220 | 5.12 |
| Nitride | 160 | 13.84 |
| I-Line PR | 7,900 | 3.26 |

BCB selectivity over silicon nitride (Nitride) was improved as expected.

Based on the experience in etching BCB, two additional low k dielectric materials were etched. These materials were SILK and FLARE 2.0.

EXAMPLE 6

Figure 7A:
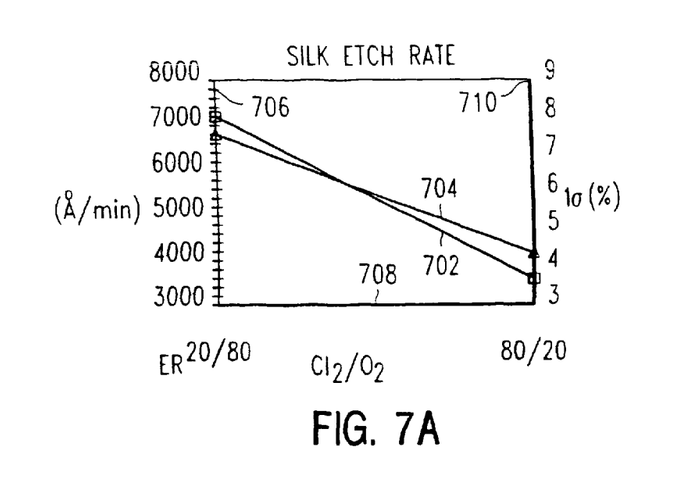
FIGS. 7A through 7C show etch rate, and etch rate non-uniformity across a wafer surface, for SILK low k dielectric material as a function of various etch process variables.
Figure 7B:
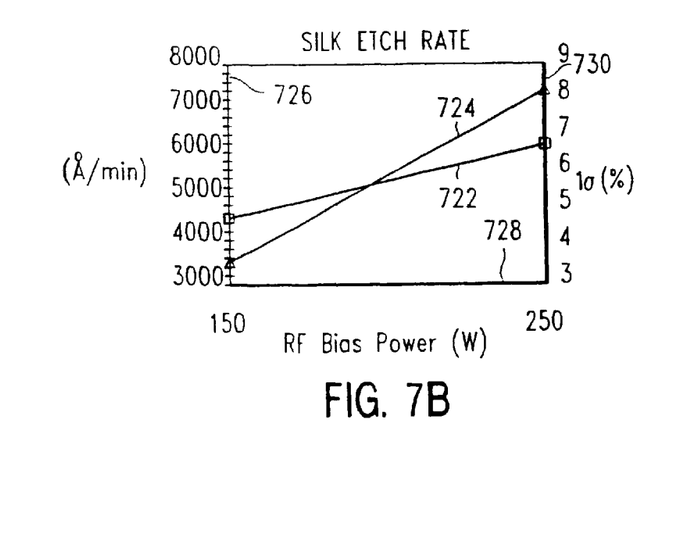
Figure 7C:
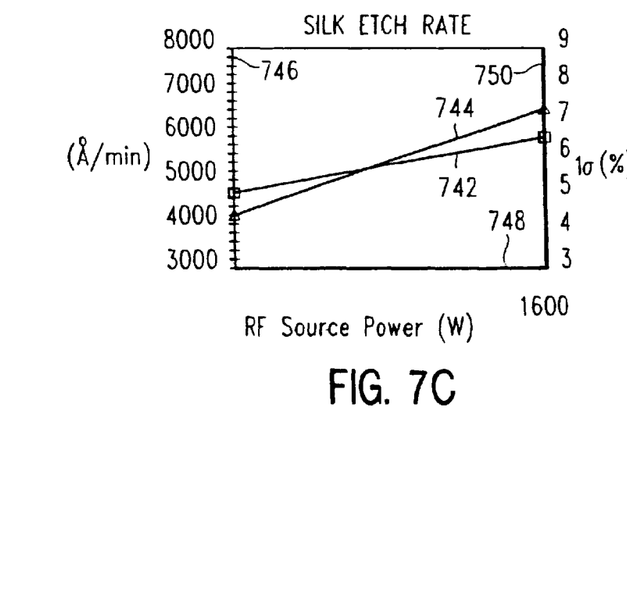
Figure 7D:
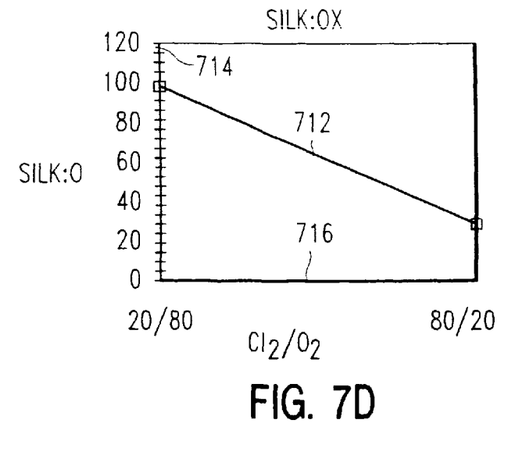
FIGS. 7D through 7F show etch rate selectivity for SILK low k dielectric material over Silicon Dioxide, as a function of various etch process variables.
Figure 7E:
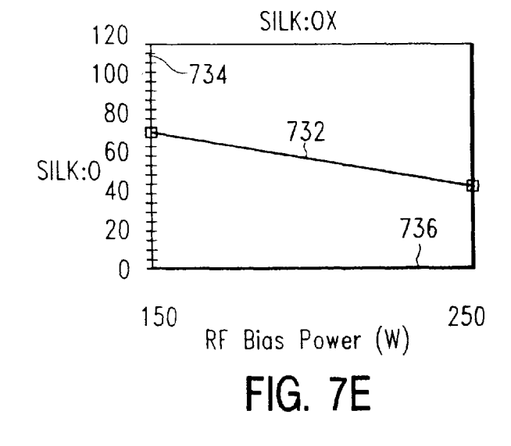
Figure 7F:
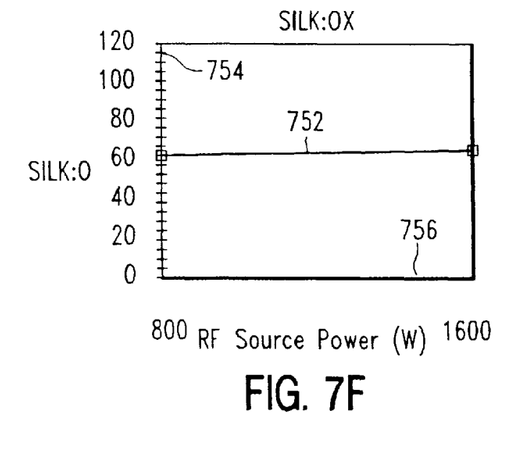

FIGS. 7A through 7F show data for the etch of SILK low k dielectric material. In particular, FIGS. 7A, 7B and 7C show the effect on etch rate of SILK attributable to change in the $Cl_2:O_2$ volumetric ratio of the plasma source gases; the effect on etch rate of a change in the RF Bias Power to the substrate support platen; and, the effect on etch rate of a change in the RF Source Power to the plasma, respectively. Corresponding FIGS. 7D, 7E, and 7F show the non uniformity of the SILK etch rate as a function of the same process variables, respectively.

With reference to FIGS. 7A and 7D: Curve 702 of FIG. 7A shows the etch rate for SILK as a function of the flow ratio of $Cl_2:O_2$ in the plasma source gas. The etch rate is shown in Å/min. on scale 706, and the $Cl_2:O_2$ ratio is shown on scale 708. Curve 704 of FIG. 7A shows the % of the 1 σ variation, as a function of the $Cl_2:O_2$ ratio, with the % of 1 σ being shown on scale 710. As is readily apparent, there is a decrease in both the etch rate and in the 1 σ variation with an increase in the ratio, over the range evaluated. Curve 712 of FIG. 7D shows the selectivity ratio of SILK in preference over Silicon Dioxide as a function of the ratio of $Cl_2:O_2$, with selectivity indicated on scale 714 and $Cl_2:O_2$ ratio being shown on scale 716. The selectivity is shown to decrease from about 95:1 (SILK: Silicon Dioxide) to about 30:1 over the $Cl_2:O_2$ ratio range shown.

With reference to FIGS. 7B and 7E: Curve 722 of FIG. 7B shows the etch rate for SILK as a function of the RF Bias Power to the substrate support platen (cathode). The etch rate is shown in Å/min. on scale 726, and the RF Bias Power is shown on scale 728. Curve 724 of FIG. 7B shows the % of the 1 σ variation, as a function of the RF Bias Power, with the % of 1 σ being shown on scale 730. As is readily apparent, there is an increase in both the etch rate and in the 1 σ variation with an increase in the Bias Power over the range evaluated. Curve 732 of FIG. 7E shows the selectivity ratio of SILK in preference over Silicon Dioxide as a function of the RF Bias Power, with selectivity indicated on scale 734 and Bias Power being shown on scale 736. The selectivity is shown to decrease from about 75:1 (SILK: Silicon Dioxide) to about 55:1 over the RF Bias Power range shown.

With reference to FIGS. 7C and 7F: Curve 742 of FIG. 7C shows the etch rate for SILK as a function of the RF plasma Source Power. The etch rate is shown in Å/min. on scale 746, and the RF Bias Power is shown on scale 748. Curve 744 of FIG. 7C shows the % of the 1 σ variation, as a function of the RF Source Power, with the % of 1 σ being shown on scale 750. As is readily apparent, there is an increase in both the etch rate and in the 1 σ variation with an increase in the Source Power over the range evaluated. Curve 752 of FIG. 7F shows the selectivity ratio of SILK in preference over Silicon Dioxide as a function of the RF Source Power, with selectivity indicated on scale 754 and Source Power being shown on scale 756. The selectivity is shown to remain relatively constant over the RF Source Power range shown.

EXAMPLE 7

Figure 8A:
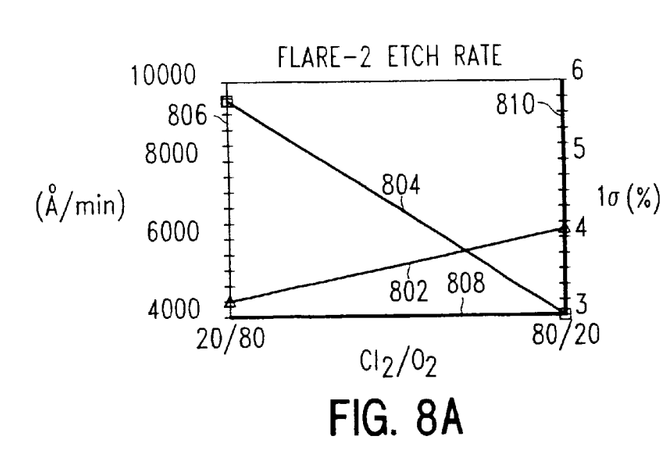
FIGS. 8A through 8C show etch rate, and etch rate non-uniformity across a wafer surface, for FLARE 2.0 low k dielectric material as a function of various etch process variables.
Figure 8B:
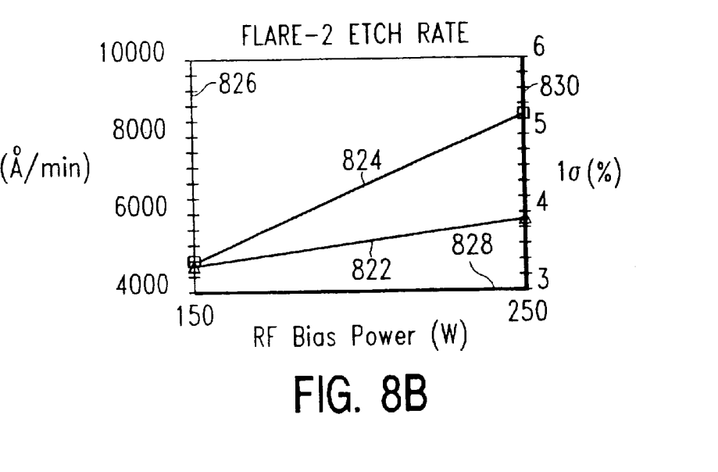
Figure 8C:
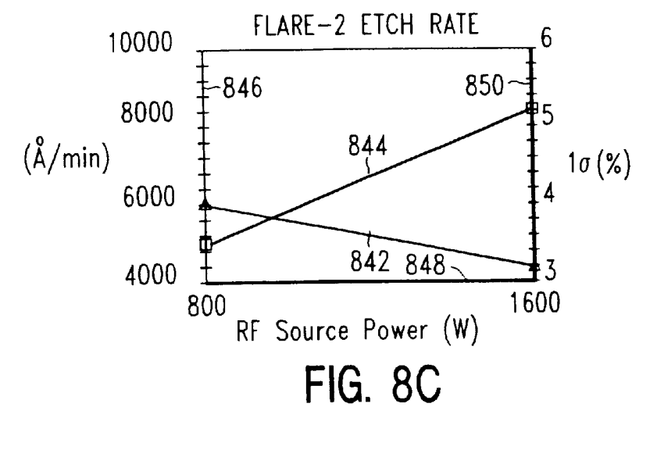
Figure 8D:
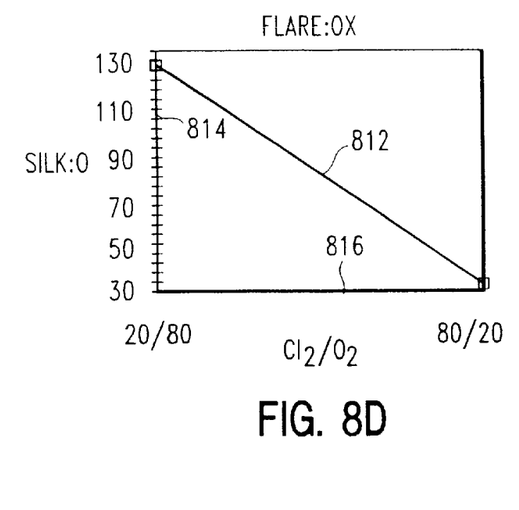
FIGS. 8D through 8F show etch rate selectivity for FLARE 2.0 low k dielectric material over Silicon Dioxide, as a function of various etch process variables.
Figure 8E:
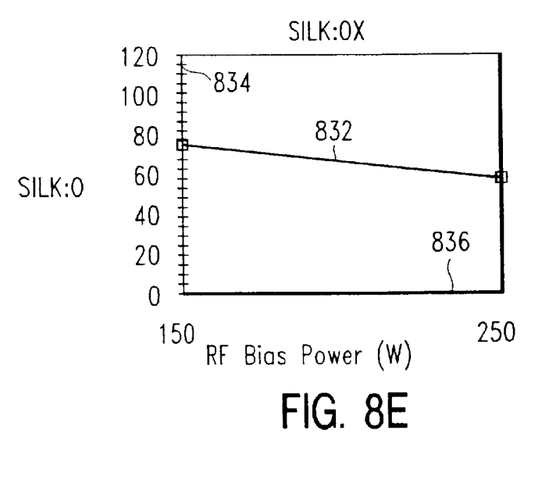
Figure 8F:
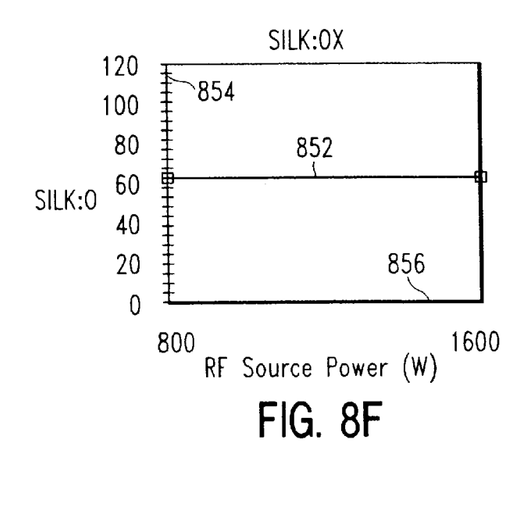

FIGS. 8A through 8F show data for the etch of FLARE 2.0 low k dielectric material. In particular, FIGS. 8A, 8B and 8C show the effect on etch rate of FLARE 2.0 attributable to change in the $Cl_2:O_2$ volumetric ratio of the plasma source gases; the effect on etch rate of a change in the RF Bias Power to the substrate support platen; and, the effect on etch rate of a change in the RF Source Power to the plasma, respectively. Corresponding FIGS. 8D, 8E, and 8F show the non uniformity of the FLARE 2.0 etch rate as a function of the same process variables, respectively.

With reference to FIGS. 8A and 8D: Curve 802 of FIG. 8A shows the etch rate for FLARE 2.0 as a function of the flow ratio of $Cl_2:O_2$ in the plasma source gas. The etch rate is shown in Å/min. on scale 806, and the $Cl_2:O_2$ ratio is shown on scale 808. Curve 804 of FIG. 8A shows the % of the 1 σ variation, as a function of the $Cl_2:O_2$ ratio, with the % of 1 σ being shown on scale 810. As is readily apparent, there is a decrease in the etch rate over the range shown, and an unexpected increase in the 1 σ variation. Although BCB showed an increase in the 1 σ variation with a decrease in the ratio of $Cl_2:O_2$, BCB contains about 5% by weight silicon and FLARE 2.0 contains no silicon. Curve 812 of FIG. 8D shows the selectivity ratio of FLARE 2.0 in preference over Silicon Dioxide as a function of the ratio of $Cl_2:O_2$, with selectivity indicated on scale 814 and $Cl_2:O_2$ ratio being shown on scale 816. The selectivity is shown to decrease from about 125:1 (FLARE 2.0: Silicon Dioxide) to about 30:1 over the $Cl_1:O_2$ ratio range shown.

With reference to FIGS. 8B and 8E: Curve 822 of FIG. 8B shows the etch rate for FLARE 2.0 as a function of the RF Bias Power to the substrate support platen (cathode). The etch rate is shown in Å/min. on scale 826, and the RF Bias Power is shown on scale 828. Curve 824 of FIG. 8B shows the % of the 1 σ variation, as a function of the RF Bias Power, with the % of 1 σ being shown on scale 830. As is readily apparent, there is a significant increase in the etch rate and a minor increase in the 1 σ variation with an increase in the Bias Power, over the range evaluated. Curve 832 of FIG. 8E shows the selectivity ratio of FLARE 2.0 in preference over Silicon Dioxide as a function of the RF Bias Power, with selectivity indicated on scale 834 and Bias Power being shown on scale 836. The selectivity is shown to decrease very slightly over the range shown.

With reference to FIGS. 8C and 8F: Curve 842 of FIG. 8C shows the etch rate for FLARE 2.0 as a function of the RF plasma Source Power. The etch rate is shown in Å/min. on scale 846, and the RF Bias Power is shown on scale 848. Curve 844 of FIG. 8C shows the % of the 1 σ variation, as a function of the RF Source Power, with the % of 1 σ being shown on scale 850. As is readily apparent, there is an increase in the etch rate and an unexpected decrease in the 1 σ variation as a result of an increase in the Source Power over the range evaluated. Curve 852 of FIG. 8F shows the selectivity ratio of FLARE 2.0 in preference over Silicon Dioxide as a function of the RF Source Power, with selectivity indicated on scale 854 and Bias Power being shown on scale 856. The selectivity is shown to increase from about 65:1 (FLARE 2.0: Silicon Dioxide) to about 90:1 over the RF Source Power range shown.

EXAMPLE 8

The data presented above was for a single layer of BCB, or SILK, or FLARE 2.0 on a thermal oxide substrate surface. The next step was to evaluate patterned etching of a low k dielectric layer surface.

Figure 9A:
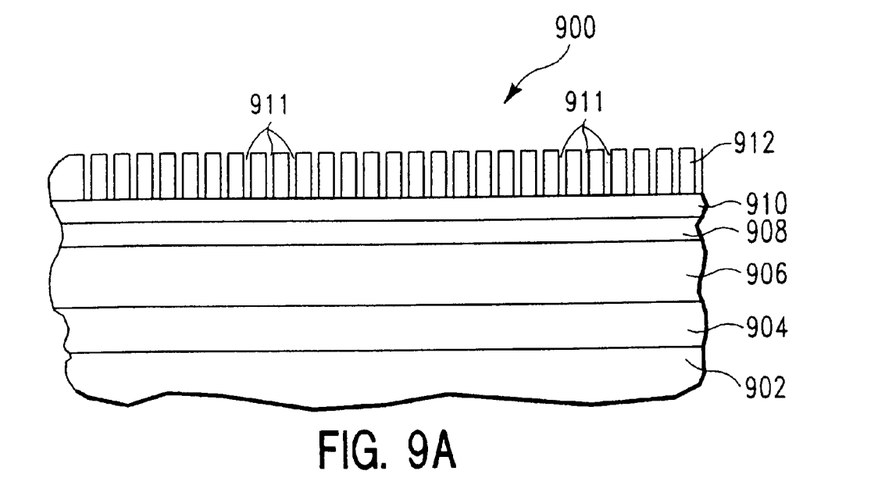
FIGS. 9A through 9C show a schematic of a BCB substrate and accompanying etch stack progressing through a series of process steps in the pattern etching of the BCB substrate.
Figure 9B:
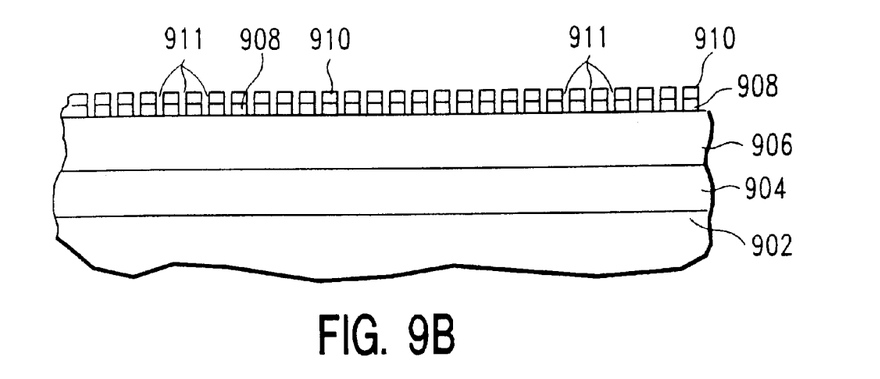
Figure 9C:
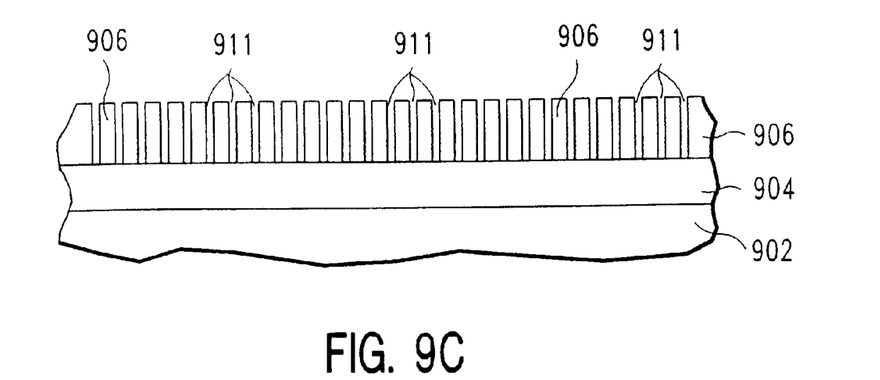

FIGS. 9A through 9C show schematics of a BCB substrate and accompanying etch stack progressing through a series of process steps in the pattern etching of the BCB substrate. The schematics are not to scale. With reference to FIG. 9A, the etch stack on a substrate is shown as structure 900. The underlying substrate 902 is a silicon wafer. The etch stack includes a $0.8\mu$ thick layer of patterned photoresist 912. The pattern is a series of trenches 911, where the feature size of a trench is about $0.25\mu$. Underlying photoresist 912 is a $0.07\mu$ thick layer of an organic-based anti-reflective coating (ARC) 910. Underlying ARC 910 is a $0.1\mu$ thick layer of a silicon dioxide hard masking material 908. Underlying the oxide hard masking material 908 is a $1.0\mu$ thick layer of BCB 906. Underlying the BCB layer 906 is a $0.5\mu$ thick layer of TEOS 904. And, underlying the TEOS layer 904 is a silicon wafer substrate 902. Since the ARC layer 910 and oxide hard mask layer 908 have not yet been opened, a $CHF_3/Cl_2$ based plasma source gas chemistry is used to etch through these two layers, producing the structure shown in FIG. 9B. The plasma etch conditions were as follows: 50 sccm of $CHF_3$ and 30 sccm of $Cl_2$; Source Power 1400 W; Bias Power 100 W; process chamber pressure 10 mT; helium back pressure to the substrate backside of 7 Torr; cathode temperature 30° C.; and, etch time of 65 seconds.

FIG. 9B shows the BCB substrate 906 after the $CHF_3/Cl_2$ plasma etch, where overlying layers of oxide hard mask 908 and ARC 910 have been patterned.

Subsequently, the BCB layer was etched using the etch chemistry of the present invention. The particular etch conditions used were as follows: 60 sccm $Cl_2$ and 60 sccm $O_2$; Source Power 1200 W; Bias Power 350 W; process chamber pressure 10 mT; helium back pressure to the substrate backside of 7 Torr; cathode temperature 30° C.; and, etch time of 60 seconds. The resulting structure is shown in FIG. 7C, where patterned BCB layer 906 overlies TEOS layer 904 which is supported upon a silicon wafer.

Figure 10A:
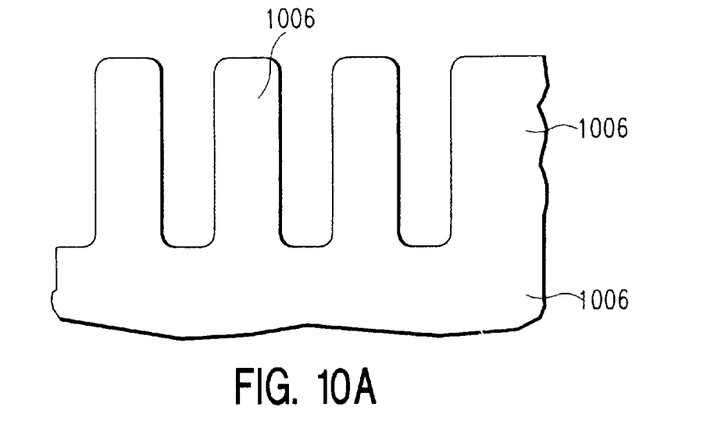
FIG. 10A shows a schematic which is representative of a photomicrograph of the patterned etch of BCB 0.25μ dense trenches at the wafer center.

FIG. 10A is a schematic representing the photomicrograph of the etched BCB, showing in more detail the etch profile achieved for patterned BCB densely located trenches near wafer center. The etched BCB is labeled 1006 and the underlying substrate TEOS is not shown in FIG. 10A. Vertical profiles were achieved at a high etch rate, even for $0.25\mu$ feature size. The etch non-uniformity across the wafer is about the same as that for a blank BCB substrate.

Figure 10B:
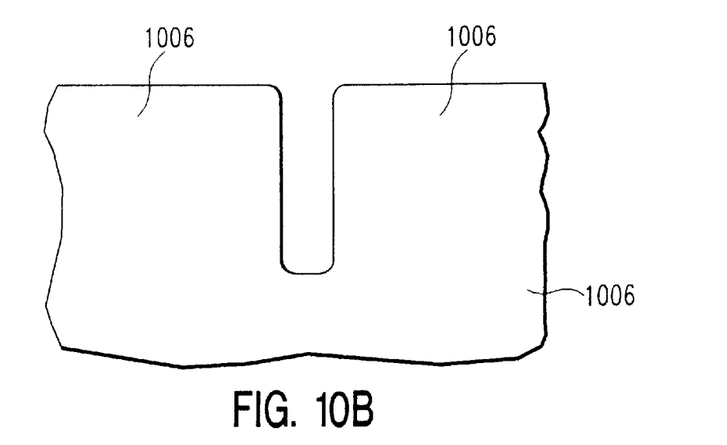
FIG. 10B shows a schematic which is representative of a photomicrograph of the patterned etch of an isolated BCB 0.25μ trench at the wafer center.

FIG. 10B is a schematic representing the photomicrograph of the etched BCB, showing in more detail the etch profile achieved for a patterned BCB isolated trench near wafer center. Again, the etched BCB is labeled 1006 and the TEOS substrate is not shown in FIG. 10B. An excellent vertical profile was achieved.

The various etch rates and the micro loading data for the dense trench pattern and for the isolated trench are shown in Table 4 below.

TABLE 4

PATTERNED BCB ETCH RATE OF $0.25\mu$ TRENCH AT DIFFERENT LOCATIONS

| Location | Dense Trenches Etch Rate (Å/min.) | Isolated Trench Etch Rate (Å/min.) | $\mu$-loading (%) |
|---|---|---|---|
| Top | 7,300 | 8,200 | 11.6 |
| Center | 7,500 | 8,300 | 10.1 |
| Bottom | 8,200 | 8,800 | 7.1 |
| Left | 7,800 | 8,400 | 7.4 |
| Right | 7,700 | 8,400 | 8.7 |
| Max − Min (%) | 12 | 7.2 | Ave. 9.0 |

$\mu$-loading refers to the etch rate difference between an isolated trench and a dense trench.

$$\text{The Max} - \text{Min}(\%) = \frac{\text{Max. etch rate} - \text{Min. etch rate}}{(\text{Max. etch rate} + \text{Min. etch rate})/2} \times 100$$

where the etch rates are measured across the wafer.

EXAMPLE 9

The BCB pattern etched in EXAMPLE 8 contained approximately 5% by weight silicon. In order to test the etch chemistry of the present invention on an organic-based low k dielectric having no silicon content, we etched a fluorinated polyimide low k dielectric. The etch stack was the basically the same as that used in EXAMPLE 8, and the etch steps were the same. The ARC and oxide hard mask layers were patterned using the following etch chemistry and process conditions: 50 sccm of $CHF_3$ and 30 sccm of $Cl_2$; Source Power 1400 W; Bias Power 100 W; process chamber pressure 10 mT; helium back pressure to the substrate backside of 7 Torr; cathode temperature 30° C.; and, etch time of 67 seconds.

Subsequently, the FPI layer was etched using the etch chemistry of the present invention. The particular etch conditions used were as follows: 60 sccm $Cl_2$ and 60 sccm $O_2$; Source Power 1200 W; Bias Power 350 W; process chamber pressure 10 mT; helium back pressure to the substrate backside of 7 Torr; cathode temperature 30° C.; and, etch time of 50 seconds.

Figure 11:
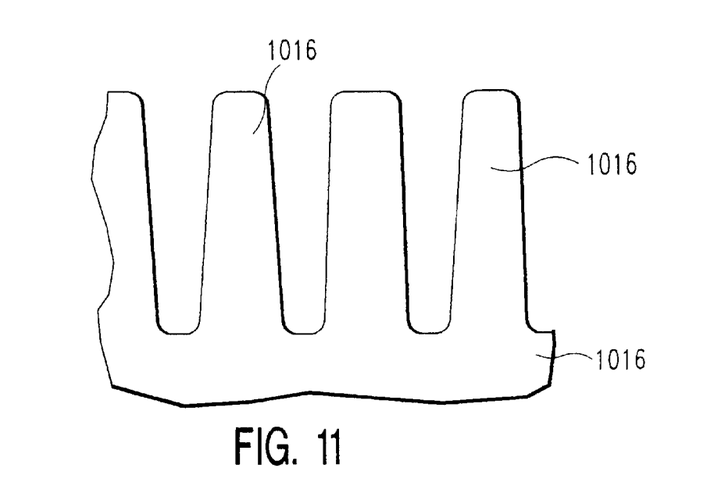
FIG. 11 shows a schematic which is representative of a photomicrograph of the patterned etch of FPI 0.25μ dense trenches at the wafer center.

FIG. 11 is a schematic representing the photomicrograph of the etched FPI, showing in more detail the etch profile achieved for patterned FPI densely located trenches near wafer center. The etched FPI is labeled 1016 and the TEOS substrate is not shown in FIG. 11. Vertical profiles were achieved at a high etch rate, even for $0.25\mu$ feature size. The FPI etch rate is faster than BCB, apparently because FPI film is less dense.

The above described preferred embodiments are not intended to limit the scope of the present invention, as one skilled in the art can, in view of the present disclosure expand such embodiments to correspond with the subject matter of the invention claimed below.

We claim:

1. A method for selectively plasma etching an opening into a low k dielectric material to produce a cavity useful in forming a conductive interconnect structure, said method comprising: selectively etching a low k dielectric material relative to an adjacent oxide or nitride or combination thereof, by contacting said low k dielectric material with a plasma generated from a plasma source gas comprising oxygen and a halogen-comprising gas where said halogen is not fluorine, and wherein an etch selectivity is at least 10:1 for said low k dielectric material relative to said adjacent oxide or nitride or combination thereof.

2. The method of claim 1, wherein said source gas includes a halogen-comprising gas selected from the group consisting of $Cl_2$, $Br_2$, $I_2$, ICl, IBr, BrCl, HCl, $BCl_3$, $CHCl_3$, $CH_2Cl_2$, $CCl_4$, $C_2H_3Cl_3$, $C_2H_4Cl_2$, $SiCl_4$, HBr, $CH_3Br$, $C_2H_2Br_2Cl_2$, HI, $CCl_2O$, $CCl_3NO_2$, and combinations thereof.

3. The method of claim 1, or claim 2, wherein said halogen is chlorine.

4. The method of claim 2, wherein said source gas includes an oxygen-comprising gas selected from the group consisting of $O_2$, CO, $CO_2$, $CH_4O$, $C_2H_6O$, $N_2O$, $NO_2$, $O_3$, $H_2O$, and combinations thereof.

5. The method of claim 1, or claim 2, or claim 4, wherein an additive is used in combination with said oxygen and said halogen-comprising gas, and wherein said additive is less than about 15 volumetric percent of the total plasma source gas supply.

6. The method of claim 5, wherein said additive is selected from the group consisting of $N_2$; $H_2$; $C_xH_y$; $CF_4$; $NF_3$; and combinations thereof, where x is less than about 3 and y is less than about 8.

7. The method of claim 5, wherein said additive is selected from the group consisting of $N_2$, $H_2$, $C_xH_y$, $CF_4$, $NF_3$, helium, neon, argon, krypton, xenon, and combinations thereof, wherein x is less than about 3, and y is less than about 8.

8. The method of claim 3, wherein an etch rate for said low k dielectric material using said source gas comprising chlorine and oxygen is at least about 8,000 Å/min.

9. The method of claim 1, wherein said low k dielectric material is a polymer-based material.

10. The method of claim 9, wherein said polymer-based material is an organic-based material.

11. The method of claim 1, wherein an atomic ratio of said halogen to said oxygen ranges from about 1:20 to about 20:1.

12. The method of claim 11, wherein said atomic ratio of said chlorine to said oxygen ranges from about 1:10 to about 5:1.

13. The method of claim 1, wherein said plasma source gas contains an additive in the amount of 15% or less in volume, which additive improves selectivity for etching said low k dielectric material over an adjacent material, or improves an etch profile, or improves control over a critical etched dimension.

14. The method of claim 13, wherein said additive improves selectivity for etching said low k dielectric material relative to an oxide which contains at least 30 atomic percent oxygen.

15. The method of claim 14, wherein said oxide is an oxide of silicon.

16. The method of claim 13, wherein said additive improves selectivity for etching said low k dielectric material relative to a nitride which contains at least 30 atomic percent nitrogen.

17. The method of claim 16, wherein said nitride is a nitride of silicon.

18. The method of claim 1 or claim 13, wherein said low k dielectric material does not contain silicon.

19. The method of claim 1 or claim 13, wherein said low k dielectric material is selected from the group consisting of Poly(arylene)ethers; Poly(arylene)ether oxazoles; Fluorinated poly(arylene)ethers; Parylene-N; Parylene-F; Parylene-AF; Parylene-AF4; Polyimides; Polynapthalene-N; Polynaphthalene-F; Perfluorocyclobutene; Polytetrafluoroethylene; Polyphenyl-Quinoxalines; Polybenzoxazoles; Polyindane; Polynorborene; Polystyrene; Polyphenyleneoxide; Polyethylene; Polypropylene; alpha-carbons; SILK™, and combinations thereof.

20. The method of claim 1 or claim 13, wherein said low k dielectric material is selected from the group consisting of BCB, FPI, SILK™, FLARE™ 2.0, and combinations thereof.

21. The method of claim 1, wherein said combination of oxide and nitride is silicon oxynitride.

22. The method of claim 1, wherein said low k dielectric material is uniformly etched within 10% or less of 1 σ across a wafer surface.

23. A method for selectively plasma etching back a low k dielectric material deposited over the surface of a patterned conductive material, to provide isolation of conductive lines and contacts, wherein said low k dielectric material is selectively etched relative to an adjacent oxide or nitride or combination thereof, by contacting said low k dielectric material with a plasma generated from a non-fluorine-containing source gas comprising chlorine and oxygen, and wherein an etch selectivity for said low k dielectric material relative to an adjacent oxide or nitride or combination thereof is at least 10:1.

24. The method of claim 23, wherein said source gas includes a chlorine-comprising gas selected from the group consisting of $Cl_2$, ICl, BrCl, HCl, $BCl_3$, $CHCl_3$, $CH_2Cl_2$, $CCl_4$, $C_2H_3Cl_3$, $C_2H_4Cl_2$, $SiCl_4$, $C_2H_2Br_2Cl_2$, $CCl_2O$, $CCl_3NO_2$, and combinations thereof.

25. The method of claim 23, wherein said source gas includes an oxygen-comprising gas selected from the group consisting of $O_2$, CO, $CO_2$, $CH_4O$, $C_2H_6O$, $N_2O$, $NO_2$, $O_3$, $H_2O$, and combinations thereof.

26. The method of claim 23, or claim 24, or claim 25, wherein an additive is used in combination with said non-fluorine-containing source gas comprising oxygen and chlorine, and wherein said additive is less than about 15 volumetric percent of the total plasma source gas supply.

27. The method of claim 26, wherein said additive is selected from the group consisting of $N_2$; $H_2$; $C_xH_y$; $CF_4$; $NF_3$; and combinations thereof, where x is less than about 3 and y is less than about 8.

28. The method of claim 26, wherein said additive is selected from the group consisting of $N_2$, $H_2$, $C_xH_y$, $CF_4$, $NF_3$, helium, neon, argon, krypton, xenon, and combinations thereof, wherein x is less than about 3, and y is less than about 8.

29. The method of claim 23, wherein said low k dielectric material is a polymer-based material.

30. The method of claim 29, wherein said polymer-based material is an organic-based material.

31. The method of claim 23, wherein an atomic ratio of said chlorine to said oxygen in said source gas ranges from about 1:20 to about 20:1.

32. The method of claim 31, wherein said atomic ratio of said chlorine to said oxygen ranges from about 1:10 to about 5:1.

* * * * *